United States Patent
Jones

(10) Patent No.: US 7,323,922 B1
(45) Date of Patent: Jan. 29, 2008

(54) DIGITALLY CONTROLLED GAIN STAGE HAVING AN ANALOGUE CONTROL INPUT

(75) Inventor: Christopher Geraint Jones, Maidstone (GB)

(73) Assignee: Analog Devices, Inc., Norwood, MA (US)

( * ) Notice: Subject to any disclaimer, the term of this patent is extended or adjusted under 35 U.S.C. 154(b) by 187 days.

(21) Appl. No.: 10/894,930

(22) Filed: Jul. 20, 2004

(51) Int. Cl.
 *H03L 5/00* (2006.01)
(52) U.S. Cl. ............... 327/308; 327/318; 327/324; 330/129; 330/131; 330/279
(58) Field of Classification Search ............ None
 See application file for complete search history.

(56) References Cited

U.S. PATENT DOCUMENTS

| | | | | |
|---|---|---|---|---|
| 5,001,430 A | * | 3/1991 | Peterman et al. ........... | 324/326 |
| 5,606,625 A | * | 2/1997 | Dallavalle et al. .......... | 381/107 |
| 6,054,896 A | * | 4/2000 | Wright et al. ............... | 330/149 |
| 6,057,732 A | * | 5/2000 | Morishita ................... | 330/129 |
| 6,798,844 B2 | * | 9/2004 | Ratto ........................ | 375/296 |
| 6,873,668 B2 | * | 3/2005 | Yamamoto et al. ......... | 375/373 |
| 2005/0012551 A1 | * | 1/2005 | Deem et al. ................ | 330/151 |

* cited by examiner

*Primary Examiner*—Tuan T. Lam
*Assistant Examiner*—Hiep Nguyen
(74) *Attorney, Agent, or Firm*—Wolf, Greenfield & Sacks P.C.

(57) ABSTRACT

A signal processing system has a first, digitally controlled, gain element, a second, analogue controlled, gain element and a gain control unit configured to receive a gain request signal and to generate a first gain control signal to be input to the first gain element and a second gain control signal to be input to the second gain element such that the gain provided by the signal processing system corresponds to the gain request signal.

13 Claims, 3 Drawing Sheets

DIGITALLY CONTROLLED GAIN STAGE HAVING AN ANALOGUE CONTROL INPUT

BACKGROUND OF THE INVENTION

In a device having an analogue signal path, for example radio transmitters, radio receivers, ultrasonic receivers and other applications, the gain of that signal path is usually adjustable, commonly over a wide range. Traditionally, an analogue control voltage or current has been used to vary the gain using a voltage or current controlled amplifier. However, it is becoming increasingly desirable to adjust the gain of a system using stages that can have their gain switched digitally, since digitally switched gain control stages potentially have improved power consumption or generate less electrical noise. In a completely digital system the gain control signal provided to the digitally switched gain control stages can itself be a digital signal. However, it is also desirable to retain the facility to accept an analogue control input signal to a digitally switched gain control stage for reasons of compatibility or interchangeability with existing devices, or for use inside an analogue feedback loop, amongst other reasons.

One possible approach is to simply digitize the analogue gain control signal using an analogue to digital converter (ADC) and then use the resulting digital value to control the digitally controlled gain stages, together with any present analogue controlled gain stages via a digital to analogue converter (DAC). However, a disadvantage with this approach is that there are gain values in between the possible output values of the ADC that are impossible to obtain, because of the finite resolution of the ADC. Additionally, in applications such as some mobile telephone transmitters, where the gain control voltage may change only infrequently, but where the gain of the signal chain must respond rapidly when the gain control signal does change, there is an additional problem with the use of an ADC to digitize the control voltage. In some systems no information is available to describe at which point in time a change in the gain control signal will take place. If it is not known when the gain control voltage is liable to change, then to respond quickly to changes in the gain control voltage, the ADC must be continuously converting the analogue input signal, which will mean that there is a continuous power consumption in the ADC, which is generally undesirable. Furthermore, there will therefore be continuous switching activity in the ADC, which is liable to generate spurious radio frequency signals, which are also undesirable.

SUMMARY OF THE INVENTION

According to a first aspect of the present invention there is provided gain control circuitry for controlling the gain of a signal path, the gain control circuitry comprising comparator circuitry configured to receive an analogue input and provide a digital output in response to receiving an analogue input having a value not within a predefined range, a bi-directional counter configured to provide a digital gain control signal to a digitally controlled gain device and configured to change the digital gain control signal in response to receiving the digital output from the comparator circuitry, a digital-to-analogue converter configured to convert the digital gain control signal to an analogue signal and a subtractor configured to receive the analogue signal from the digital-to-analogue converter and an analogue gain control signal and to provide an analogue output signal representative of the difference between the value of the digital gain control signal and the analogue gain control signal, the analogue output signal being provided as the analogue input to the comparator circuitry.

The bi-directional counter may further be configured to increase the value of the digital gain control signal in response to the analogue input signal to the comparator circuitry being greater than a first predetermined threshold value. Similarly, the bi-directional counter may be configured to decrease the value of the digital control signal in response to the analogue input signal to the comparator circuitry being less than a second predetermined threshold value.

The bi-directional counter may be configured to be responsive to the digital output from the comparator circuits only when in receipt of a clock signal and may include circuitry arranged to inhibit receipt of the clock signal when no digital output is provided by the comparator circuitry.

According to a second aspect of the present invention there is provided a gain control system for controlling the gain applied to a signal, the gain control system comprising a digitally controlled element configured to receive an input signal and a digital gain control signal and to apply a gain to the input signal in accordance with the digital gain control signal, comparator circuitry configured to receive an analogue input and provide a digital output in response to receiving an analogue input having a value not within a predefined range, a bi-directional counter configured to provide the digital gain control signal and to change the value of the digital gain control signal in response to receiving the digital output from the comparator circuit, a digital-to-analogue converter configured to convert the digital gain control signal to an analogue signal and a subtractor configured to receive the analogue signal from the digital-to-analogue converter and an analogue gain control signal and to provide an analogue output signal representative of the difference in value between the analogue gain control signal and the digital gain control signal, the analogue output signal being provided as the analogue input signal to the comparator circuitry.

The gain control system may further comprise an analogue controlled gain element having a gain control input in communication with the analogue output of the subtractor. The analogue controlled gain element and the digitally controlled element may be connected in series or in parallel.

The gain control system may further comprise a logic element having an input coupled to the output of the bi-directional counter and having a first output coupled to the digitally controlled gain element and second output coupled to the analogue controlled gain element, the logic element being arranged to provide first and second gain control signals at the first and second outputs respectively in dependence on the signal received at the input of the logic element. The sum of the value of the first and second gain control signals provided by the logic element preferably equals the value of the signal received at the input of the logic element, possibly with a constant added or converted to a different number system or code.

The gain control system may further comprise an exponentiating element having an input arranged to receive the analogue output signal from the summing element and having an output coupled to the analogue controlled gain element, the exponentiating element being configured to generate an analogue output signal having a value proportional to the exponential of the value of the received analogue input signal.

In further embodiments, the gain control system may comprise an exponentiating digital-to-analogue converter having a first input coupled to the second output of the logic element and an output coupled to the analogue controlled gain element, the exponentiating digital-to-analogue converter being configured to provide an analogue signal at its output having a value proportional to the exponential of the value of a digital signal received at the first input. In further embodiments, the exponentiating digital-to-analogue converter may have a second input arranged to receive a reference value, the exponentiating digital-to-analogue converter being configured to multiply the analogue output signal by a value proportional to the reference value.

According to a further aspect of the present invention there is provided a gain control system for controlling the gain applied to a signal, the gain control system comprising a digitally controlled gain element configured to receive a first input signal and a digital gain control signal and to apply a gain to the first input signal in accordance with the digital gain control signal, an analogue controlled gain element configured to receive a second input signal and a first analogue gain control signal and to apply a gain to the second input signal in accordance with the received first analogue gain control signal, comparator circuitry configured to receive an analogue input and provide a digital output in response to receiving an analogue input having a value not within a predefined range, a bi-directional counter configured to provide the digital gain control signal and to change the value of the digital gain control signal in response to receiving the digital output from the comparator circuitry, a digital-to-analogue converter configured to convert the digital gain control signal to an analogue signal and a subtracting element configured to receive the analogue signal from the digital-to-analogue converter and a second analogue gain control signal and to provide an analogue output signal representative of the difference in value between the second analogue gain control signal and the digital gain control signal, the analogue output signal being provided as the analogue input signal to the comparator circuitry and as the first analogue control signal to the analogue controlled gain element.

According to a further aspect of the present invention there is provided a gain control system comprising a subtracting element having a first input arranged to receive an analogue gain control signal, a second analogue input and an output, the subtracting element being configured to provide a first output signal representative of the difference in value between the analogue gain control signal received at the first input and an analogue signal received at the second input, comparator circuitry configured to receive the first analogue output signal from the subtracting element and to provide a digital output in response to the received analogue output signal having a value not within a predefined range, a bi-directional counter having an input coupled to the output of the comparator circuitry and an output coupled to the second analogue input of the subtracting element via a first digital-to-analogue converter, the bi-directional counter being arranged to provide a second output signal at the output and to incrementally change the value of the second output signal in response to receiving the digital output from the comparator circuitry, a logic unit having an input coupled to the output of the bi-directional counter and configured to generate first and second partial gain control signals in accordance with the output of the bi-directional counter, the logic unit having first and second outputs arranged to provide the first and second partial gain control signals respectively, a digitally controlled gain element having a gain control input coupled to the first output of the logic unit, and an analogue controlled gain element having a gain control input coupled to the second output of the logic unit via a second digital-to-analogue converter.

According to a further aspect of the present invention there is provided an amplifier having a first, digitally controlled, gain element, a second, analogue controlled, gain element and a gain control unit configured to receive a gain request signal and to generate a first gain control signal to be input to the first gain element and a second gain control signal to be input to the second gain element, such that the gain provided by the amplifier corresponds to the gain request signal.

BRIEF DESCRIPTION OF THE DRAWINGS

Embodiments of the present invention will be described hereinafter, by way of illustrative example only, with reference to the accompanying figures, of which.

DESCRIPTION OF EMBODIMENTS OF THE PRESENT INVENTION

Figure 1:
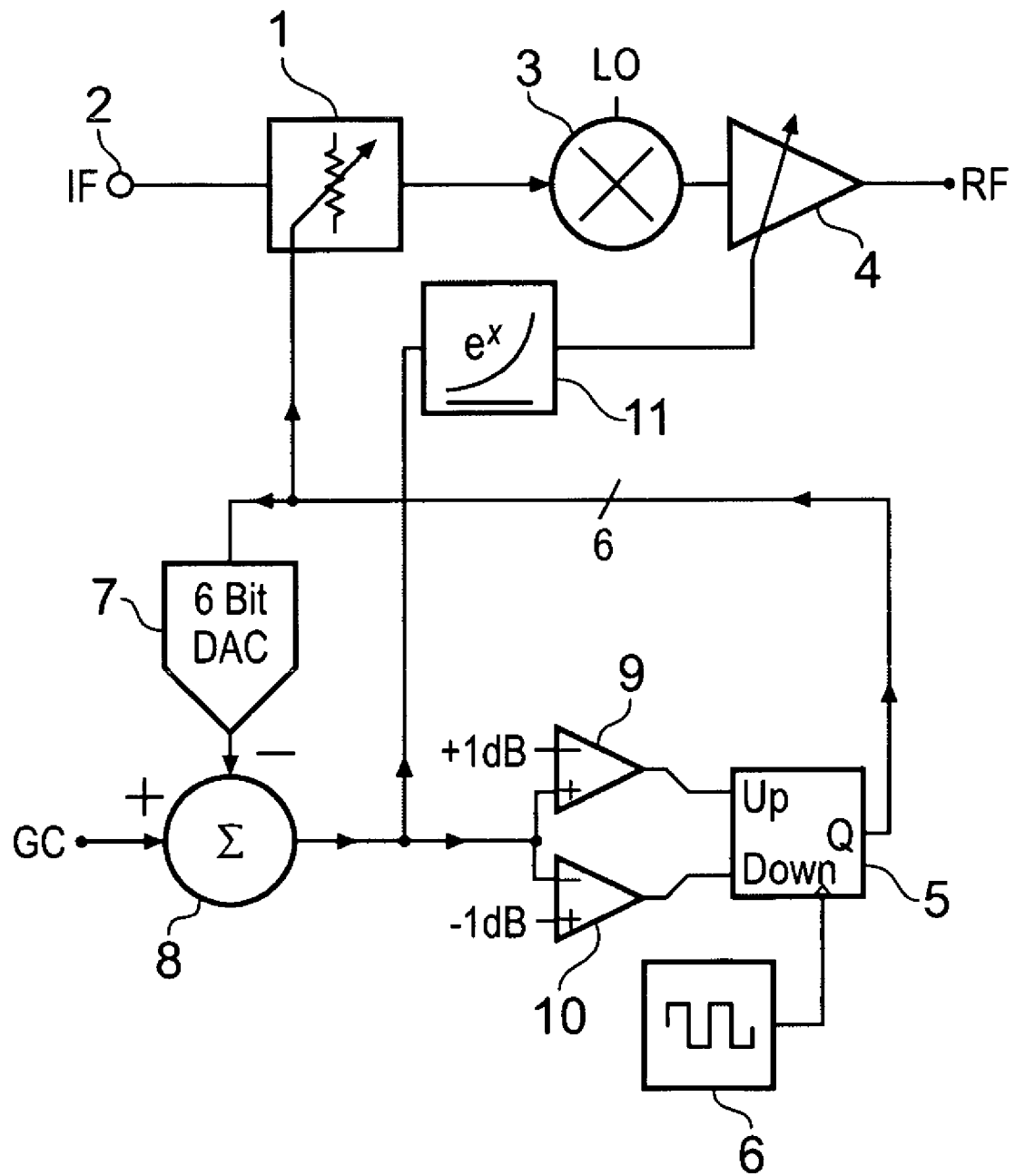
FIG. 1 diagrammatically shows a gain control system according to a first embodiment of the present invention having both a digitally controlled gain stage and an analogue controlled stage and having an analogue controlled input.

FIG. 1 diagrammatically illustrates a first embodiment of the present invention and shows a gain control system having an analogue control input and a digitally controlled gain stage. The system comprises a digitally switched attenuator 1 having, for example, 1 dB increments of attenuation. The digitally switched attenuator receives at a first input 2 an analogue signal at an intermediate frequency. The output from the digitally switched attenuator is fed to an up-converting mixer 3 that also receives an input signal from a local oscillator LO and which converts the output signal from the attenuator 1 to a higher frequency. The output from the mixer 3 is fed to a radio frequency variable gain amplifier 4 having a gain linearly proportional to an input control signal. The output of the RF amplifier 4 provides the RF output of the gain system.

The system also comprises a digital up-down counter 5 that, upon receipt of a clock pulse from a clock generator 6, either increases its output value or decreases its output value, or neither, depending upon whether an 'up' input, a 'down' input or neither input is asserted at the time of the clock pulse. The output of the up-down counter 5 is connected as the input signal to a digital to analogue converter (DAC) 7. The DAC has the same number of possible output values as there are possible settings of the digitally switched attenuator 1. In the embodiment illustrated in FIG. 1 the DAC is a 6 bit device.

The DAC can be of either the voltage-output or current-output type, though voltage-output is used in the described embodiments for the sake of convenience. The DAC is designed in such a way that the output voltage is linearly related to the gain in decibels of the digitally switched attenuator 1. The full scale range of the DAC is therefore preferably set such that the output signal of the DAC is proportional to the gain in decibels of the digitally controlled attenuator 1 with the proportionality constant set equal to the desired control slope of the input to the entire gain system. The control slope is the number of decibels of gain increase of the system that corresponds to a 1 V increase in the gain control voltage and is expressed in decibels per volt. In preferred embodiments, the increase in the control voltage that produces a 20 decibel increase in the system gain is referred to as the constant v20 dB, which is expressed in the unit of volts.

The output of the DAC 7 is fed to the first input of an analogue subtracting device 8. An analogue control signal (GC) that is the control input to the gain control system as a whole is connected to a second input of the subtracting device. The subtracting device takes the analogue gain input signal GC and subtracts the DAC output signal, providing the result of the subtraction as an output of the subtracting device.

The output of the subtracting device 8 is fed to the inputs of two comparators 9 and 10. Each comparator has a fixed threshold level. The threshold of a first one of the comparators is higher than the threshold of the other comparator, by an amount greater than the difference between consecutive output levels of the DAC. In the example shown in FIG. 1, consecutive output levels from the DAC represent gain settings differing by 1 dB, whereas the comparator thresholds are 2 dB apart, +1 dB and −1 dB respectively.

The outputs of the two comparators are connected respectively to the 'up' and 'down' inputs of the up-down counter 5. In operation, if the output of the DAC is greater than the gain input signal GC by more than 1 dB the output of the analogue subtracting device 8 will be a negative value with an absolute magnitude of greater than 1 dB. This negative output will exceed the threshold value of the 'down' comparator 10 causing an output signal to be generated from the comparator 10, thereby asserting the 'down' input of the counter 5. If the output of the DAC is lower than the gain input signal GC by more than 1 dB, the threshold of the 'up' comparator 9 will be exceeded and the 'up' input of the counter 5 asserted. If the output of the DAC 7 is within 1 dB of the analogue input signal GC then neither up nor down inputs of the counter 5 will be asserted. This is because the thresholds of the two comparators are +1 dB and −1 dB in the embodiment shown. The output signal from the counter 5 is also fed to a second, control, input of the digitally switched attenuator 1, thereby increasing or decreasing the attenuation of the IF input signal. When the clock generator 6 is run continuously, the system acts as a negative feedback loop, and the counter will change its value repeatedly until the DAC value is within 1 dB of the gain control input signal.

Thus the gain of the digitally controlled stages of the signal chain will be controlled by the analogue input to the system as a whole. In general, the digital gain setting provided by the output from the counter 5 will not track the analogue input signal GC exactly, with the difference being between +1 dB and −1 dB, that is the thresholds of the two comparators 9 and 10.

The output of the DAC 7 represents the gain being provided by the digitally switched attenuator in decibels. The analogue gain input GC to the system represents the entire gain desired from the system in decibels. Therefore the output of the analogue subtracting device 8 represents the gain desired from the system as a whole in decibels minus the gain of the digital attenuator in decibels. This output signal will subsequently be referred as the 'remainder' signal.

The remainder signal, that is the output from the analogue subtractor 8, is also connected to the input of an exponentiating device 11 that has the characteristic that the voltage of its output signal will be a constant voltage multiplied by 10 raised to the power of the voltage of its input signal divided by the constant v20 dB, as previously defined with reference to the control slope. The output signal from the exponentiating circuit 11, when expressed in decibels relative to some reference voltage, will therefore be linearly proportional to the input voltage of the exponentiating circuit expressed in volts. A possible implementation of the exponentiating circuit 11 is to use the exponential current-voltage relationship of a semiconductor junction or a FET device operating in the "sub-threshold" region, although other approximations to the exponential function may be used. In implementations where the range of operation of the exponentiating circuit is sufficiently narrow, the exponential function may be approximated sufficiently accurately by a straight line, meaning that only the addition of an offset is necessary.

The output of the exponentiating circuit 11 is connected to a second, control, input of the analogue RF variable gain amplifier 4. The analogue RF amplifier 4 has the characteristic that its gain is directly proportional to the voltage on its control input. Its gain is therefore exponentially related to the voltage at the input of the exponentiating circuit, and so its gain, when expressed in decibels, will be linearly related to the voltage at the input of the exponentiating circuit, i.e. the remainder signal, and the control slope will be the same as that which was originally desired for the entire system.

Thus the gain of the analogue variable gain stage in decibels is equal to the gain in decibels represented by the analogue input signal GC to the analogue subtracting device 8, minus the gain in decibels of the digitally switched attenuator 1. Since the gain of the input signal chain is equal to the sum of the gain in decibels of the analogue controlled RF amplifier 4 and the gain in decibels of the digitally controlled switched attenuator 1, the total gain of the signal chain when expressed in dB will be linearly related to the analogue input signal GC, as desired.

The gain of the digitally controlled attenuator 1 will display hysteresis when the analogue gain control signal GC is varied up and down repeatedly. This hysteresis is present because the difference between the thresholds of the two comparators 9 and 10 is greater than the step size of the DAC 7. This is advantageous because it means that if the analogue gain control signal is held steady at a level where one comparator is on the point of switching, there will be no tendency for the digital gain setting input to the digitally switched attenuator 1 to "chatter" or repeatedly increment or decrement due to noise generated in the comparators or present in the input signal. Instead, the output of the up-down counter 5 may step once, but due to the hysteresis of the system, it will not step again until the analogue gain control input signal is changed significantly.

Figure 2:
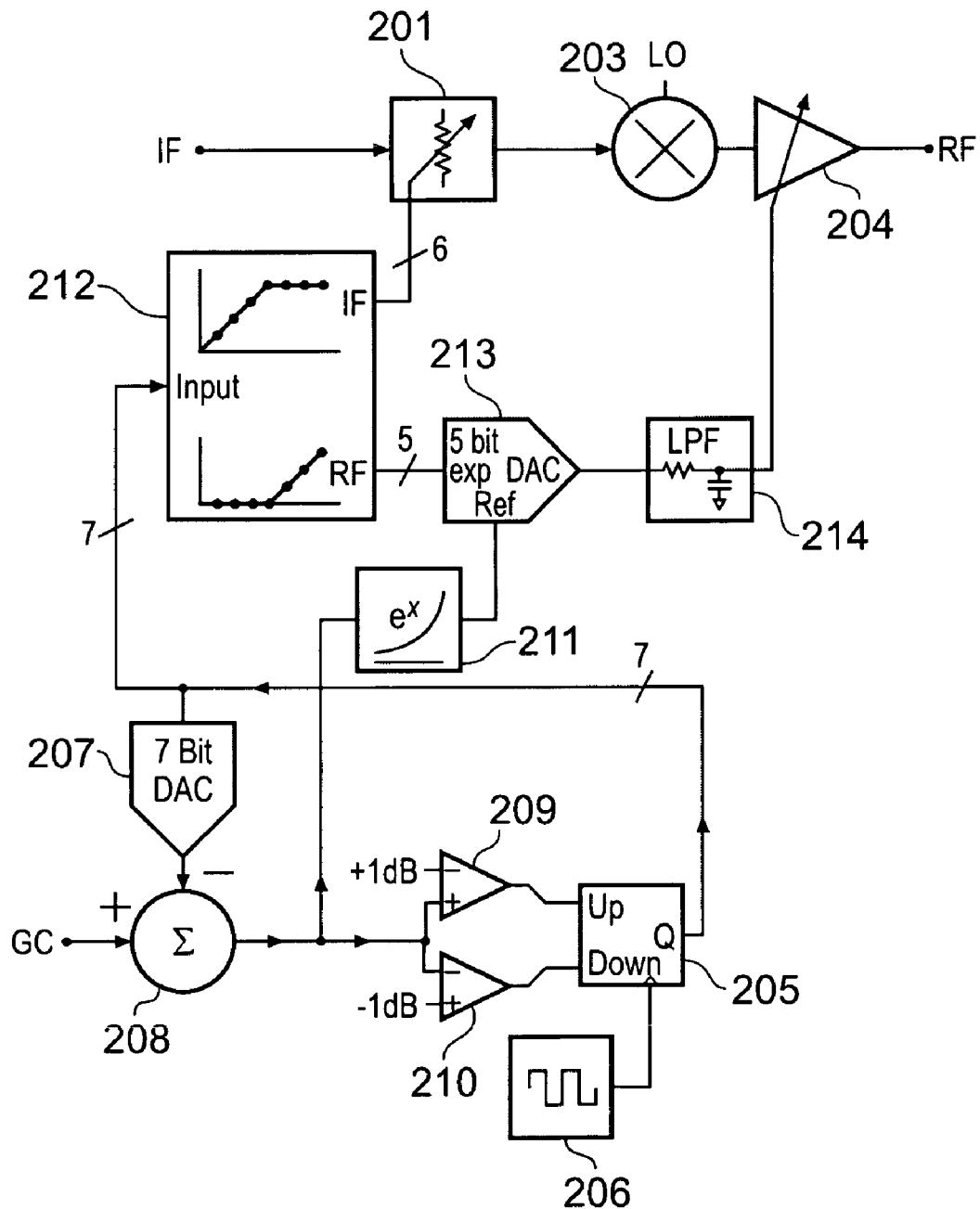
FIG. 2 diagrammatically illustrates a gain control system according to a second embodiment of the present invention having both a digitally controlled gain stage and an analogue controlled gain stage and having an analogue controlled input.

A further embodiment of the present invention is diagrammatically illustrated in FIG. 2. Where elements of the gain control system shown in FIG. 2 corresponds to elements of the embodiment shown in FIG. 1 a corresponding reference numeral is used prefixed by 2. For example, in the embodiment shown in FIG. 2 an analogue subtracting device is provided that receives as an input the analogue gain control signal GC in an analogous fashion to the analogue subtracting device 8 shown in FIG. 1 and is therefore referenced 208 in FIG. 2. As previously, an analogue intermediate frequency signal is input to a digitally switched attenuator 201, the output of which is fed to the first input of an up-converting mixer 203 that receives at a second input a local oscillator signal. The resulting output signal from the mixer 203 is fed to an analogue controlled variable gain stage 204, the output of which is the RF output signal. Similarly, an analogue gain control signal is again input to an analogue subtracting device 208 that also receives an input from a digital to analogue converter 207. The analogue output from the subtracting device 208, the "remainder signal", is again fed to the inputs of a pair of comparators 209 and 210. The output of each of the comparators 209 and 210 is fed respectively to either the "up" input or the "down" input of a counter circuit 205 that is driven by a clock generator 206. The digital counter value generated by the counter circuit 205 whenever either the up or down input is asserted is again fed to the input of the digital to analogue converter 207. The analogue output from the subtracting device 208 is also fed to the input of an exponentiating circuit 211 of an analogous type to that described with reference to FIG. 1.

The digital word provided by the counter circuit 205, which in the embodiment shown is a 7 bit word, is fed to the input of a combinational logic circuit 212. The combinational logic circuit provides a first digital output that is fed to the control input of the digitally switched attenuator 201. The combinational logic circuit 212 also produces a second digital output that is input to an exponentiating digital-to-analogue converter 213, the analogue output of which is input, via low a pass filter 214, to the control input of the analogue variable gain stage 204 (exemplified as a variable RF amplifier). The exponentiating DAC 213 has the characteristic that its output voltage increases exponentially with the digital input word received at its input, such that increasing the input word to the exponentiating DAC by one code will increase the gain of the RF amplifier by 1 dB.

The combinational logic unit 212 splits up the digital gain estimate received from the counter unit 205 and produces separate digital signals to control the digitally switched attenuator 201 and the variable RF amplifier 204. The logic unit 212 may be implemented using dedicated logic circuitry or a microprocessor controlled by appropriate programming. The combinational logic unit 212 may be implemented using further implementations as determined to be most appropriate for the particular application and as such is considered to fall within the ability of a skilled person. The combinational logic unit 212 is arranged so that when the output of the counter 205 increases by 1, either the variable RF amplifier gain is increased by 1 dB or the digitally switched attenuator gain is increased by 1 dB, the order in which the output signals from the combinational logic unit 212 change having been selected or programmed such that the signal path (the signal path through the digital attenuator 201, mixer 203 and amplifier 204) has an optimised performance and power consumption at each setting of the input code to the combinational logic circuit. In each case, the sum of the output codes from the combinational logic is equal to the input code.

In the embodiment shown in FIG. 2, the exponentiating DAC 213 is a multiplying DAC so that the gain of the RF amplifier 204 is also proportional to the signal on the reference input of the DAC, the reference input being received from the analogue exponentiating circuit 211. As the reference value to the DAC 213 is received from the exponentiating circuit 211, a signal on the input of the analogue exponentiating circuit 211 produces an increase or decrease in the gain of the variable amplifier 205, measured in decibels, that is proportional to the signal at the input of the analogue exponentiating circuit 211.

By providing the combinational logic unit 212 to control both the digitally switched attenuator 201 and the variable RF amplifier 204, via the exponential DAC 213, it is possible to provide control of the output gain of the output signal over a relatively large gain range without requiring the use of an exponentiating circuit 211 having a correspondingly broad range. This is advantageous as it is relatively complicated to provide broad range exponentiating circuits. In the embodiment shown in FIG. 2, it is possible to provide a broad range of gain control with an exponentiating circuit 211 of similar range to that provided in FIG. 1.

In preferred embodiments, the up-down counter 205 counts in GRAY code, which is a code where only 1 bit changes between consecutive numbers. This has the advantage that the set up and hold times of the up and down inputs of the counter can be made very small and it can be arranged that the result of a metastable state in the counter is at worst an error of ±1 in the count value. GRAY code also has the advantage that it can be decoded into thermometer code without any glitches and without adding additional latches or time delays. Thermometer code is a number system where each digit is 1 or 0 and the number of ones in the output is the value being represented. In preferred embodiments, the output of the up-down counter is decoded into an N-bit thermometer code that controls N switchable current sources, these current sources together making up the feedback DAC 207, the output of which is provided as one input to the analogue subtractor 208. A DAC being thermometer coded in this manner has the advantage of an excellent differential non-linearity characteristic, and also low glitch energy when changing the digital value by one.

In preferred embodiments of the present invention, an additional circuit is provided that detects when neither the up-input nor the down-input of the up-down counter 205 is asserted and when that situation occurs stops the clock generator 206. As soon as either the up or down input becomes asserted again, the clock generator 206 is restarted. This clock stopping arrangement has no or minimal effect upon the intended operation of the remainder of the circuit yet under typical conditions reduces the amount of switching activity taking place in the counter and therefore reduces the potential for radio-frequency interference being caused. The clock stopping arrangement may be implemented using simple logic circuitry, as will be appreciated by those skilled in the art.

In the embodiment shown in FIG. 2, the effect of the low pass filter 214 placed between the exponentiating DAC 213 and the variable gain amplifier 204, has the effect of reducing the higher frequency components in the amplitude envelope of the output signal. In radio transmitter applications, this has the effect of reducing the modulation sidebands that would be produced on either side of the transmitted signal and that could otherwise interfere with other uses of the radio spectrum.

In the embodiments described with reference to FIGS. 1 and 2 the analogue controlled and digitally controlled variable gain stages are connected in cascade such that the signal of interest passes through them in sequence. However, in further embodiments the digitally controlled and analogue controlled gain stages may be combined, for example by varying the bias current of an amplifier as a means of analogue gain control and also switching the value of some gain-determining resistor in the same amplifier to provide a means of digitally controlling the gain.

It will be appreciated that both the digitally controlled and analogue controlled gain elements may be implemented using a number of different types of gain stages, including "current steering" systems, varying the reference applied to a digital to analogue converter in the signal path, multiplication by a gain factor (or bit shifting) in the digital domain of signal before or after conversion to or from the analogue domain, switching gain stages in or out of the signal path using any combination of FET, bipolar and diode switches, varying the capacitance of varactor diodes or MOS capacitors, using MOS devices as controllable resistors, switching in and out resistors using MOS devices, altering the gain of a transducer by varying a characteristic of the transducer (for example the bias voltage to a capacitive microphone), changing the gain of a stage by removing or applying the DC power supplied to it, altering the resonant frequency or Q factor of a resonant circuit, using a photoconductive cell in place of a resistor, or altering the bias voltage or bias current of a transistor amplifier. This list is not to be considered exhaustive and embodiments of the present invention do not rely on any particular type of gain control stage.

In other embodiments of the present invention the exponentiating circuit 11, 211 and the linear analogue controlled amplifier 204, 4 may be combined or replaced by a single stage that has a gain exponentially related to the analogue controlled input signal. The exponential relationship does not need to be exact, only sufficiently accurate for the intended application. In some applications, this might mean that the exponential relationship does not need to be very accurate at all. Whilst in the embodiments of the present invention described with reference to FIGS. 1 and 2 digitally switched attenuator 1, 201 has steps of gain that are all a substantially constant number of decibels, this need not be the case in all embodiments of the present invention. In other embodiments the size of each step in the feedback DAC device 7, 207 output signal need only to be proportional to the size of the corresponding step in the gain of the digitally switched attenuator, when expressed in decibels, with the proportionality having the step control slope that is desired of the whole circuit. To avoid instability or "chattering" of the counter value, it is however preferable that the difference between the thresholds of the two comparators are greater than the size of the largest digitally controlled step. The value of the two thresholds can be altered based upon the value currently stored in the counter, if desired.

Figure 3:
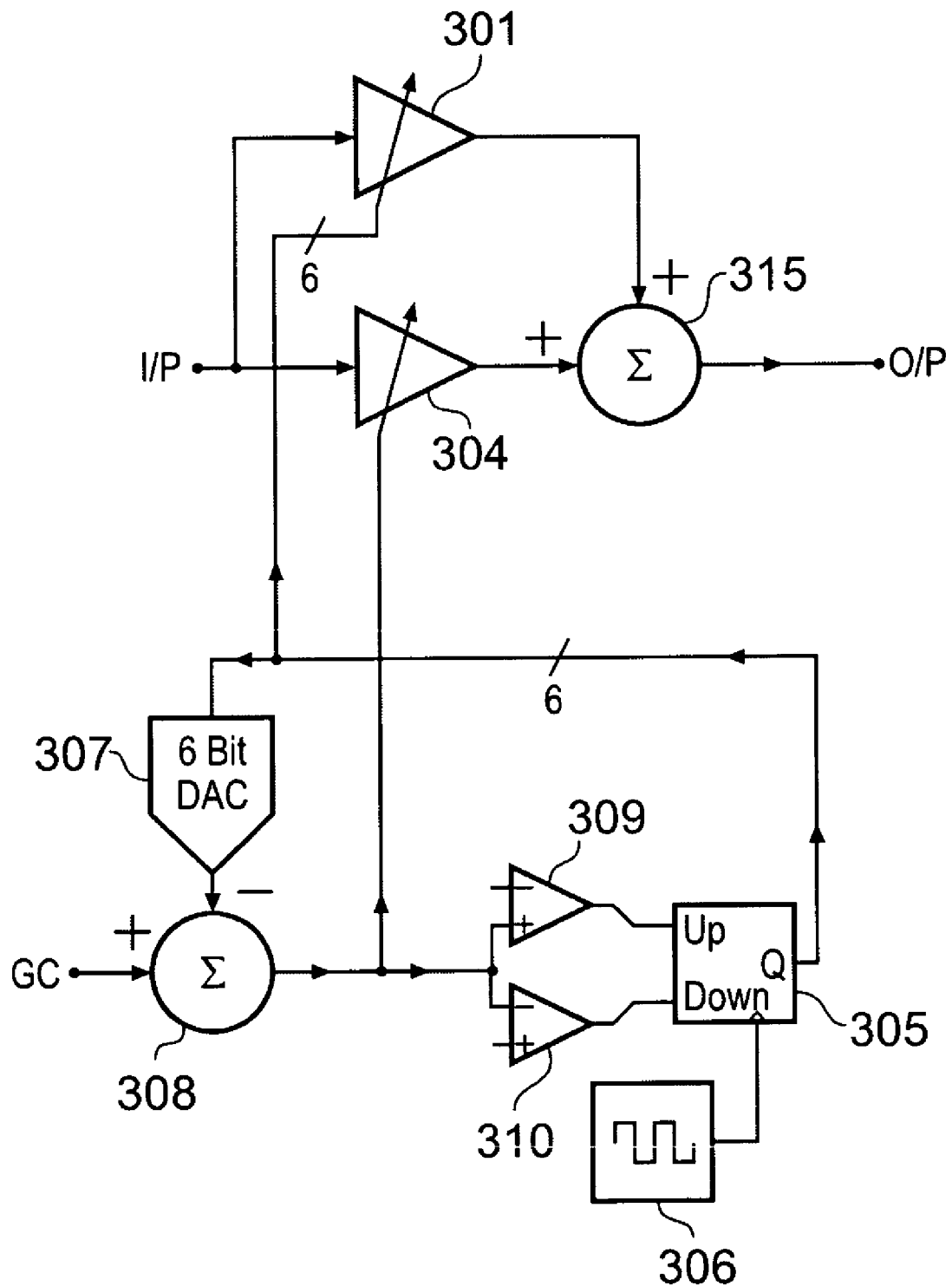
FIG. 3 diagrammatically illustrates a gain control system according to a third embodiment of the present invention having both a digitally and analogue controlled gain stage and having an analogue control input.

The embodiments of the present invention described with reference to FIGS. 1 and 2 deal with a gain control system that is linear-in-dB. However, it is possible to provide other embodiments of the present invention that provide a simple linear gain control, that is the output signal divided by the input signal is linearly related to the analogue gain control signal. Such an embodiment is shown in FIG. 3. As with the embodiment shown in FIGS. 1 and 2, an analogue control signal is provided as a first input to an analogue subtracting device 308, the output of which is provided as an input to respective up and down comparators 309, 310. The output of each of the up and down comparators is input to respective up and down inputs on a up-down counter 305. The up-down counter also receives a clock signal provided by a clock circuit 306. The output of the up-down counter 305 is provided as an input to a digital to analogue converter 307, the output of which is provided as a second input to the analogue subtracting device 308. The output from the up-down counter 305, which is a digital word, is also input as a control signal to a digitally controlled gain stage 301 that also receives as an input the input signal to be amplified.

In contrast to the digitally switched attenuator of the embodiment shown in FIGS. 1 and 2, the digitally controlled gain stage 301 shown in FIG. 1 has a gain that is linearly related to the digital control code, as opposed to the gain expressed decibels being linearly related to the control code.

The output from the analogue subtracting device 308 is provided as a control signal to an analogue gain control stage 304, which as the desired gain characteristic is to be linear in gain rather than linear in dB, does not require an exponentiating circuit, as did the embodiment shown in FIGS. 1 and 2, to precede its control input. The digitally controlled gain stage 301 and analogue control gain stage 304 provide their outputs in parallel to an analogue summation device 315, the output from which provides the overall output.

It is thus possible to provide circuitry for controlling both a digital and an analogue gain stage from a purely analogue gain control signal. An advantage of such a combined system is that the overall control of the gain applied to an input signal is smoother than if only a digital gain stage was used, due to the additional control provided by the analogue gain element. However, it will be appreciated that embodiments of the present invention are also suitable for use with digital gain elements only and provide advantages over the use of a simple ADC, for example.

The invention claimed is:

1. Gain control circuitry for controlling the gain of a signal path, the gain control circuitry comprising:
    comparator circuitry configured to receive a first analogue input and provide a first digital output in response to receiving the first analogue input having a value greater than an upper threshold value or less than a lower threshold value;
    a bi-directional counter configured to provide a digital gain control signal to a digitally controlled gain device and configured to change the value of the digital gain control signal in response to receiving the first digital output from the comparator circuitry;
    a digital-to-analogue converter configured to convert the digital gain control signal to a first analogue output signal;
    a subtractor configured to receive the first analogue output signal from the digital-to-analogue converter and an analogue gain control signal and to provide a second analogue output signal representative of the difference between the value of the first analogue output signal from the digital-to-analogue converter and the analogue gain control signal, the second analogue output signal being provided as the first analogue input to the comparator circuitry.

2. Gain control circuitry according to claim 1, wherein the bi-directional counter is configured to increase the value of the digital gain control signal in response to the first analogue input signal to the comparator circuitry being greater than the upper threshold value.

3. Gain control circuitry according to claim 1, wherein the bi-directional counter is configured to decrease the value of the digital control signal in response to the first analogue input signal to the comparator circuitry being less than the lower threshold value.

4. Gain control circuitry according to claim 1, wherein the bi-directional counter is enabled on receipt of a clock signal and the bi-directional counter includes circuitry arranged to inhibit receipt of the clock signal when the first analogue input is within the upper and lower threshold values.

5. Gain control circuitry according to claim 1, wherein said digitally controlled gain device is a digitally controlled gain element configured to receive a further analogue input signal and the digital gain control signal, and to apply a gain to the further analogue input signal in accordance with the digital gain control signal.

6. Gain control circuitry according to claim 5, further comprising an analogue controlled gain element having a gain control input arranged to receive the second analogue output signal provided by the subtractor element.

7. Gain control circuitry according to claim 6, wherein the analogue controlled gain element and the digitally controlled gain element are cascaded.

8. Gain control circuitry according to claim 6, wherein the analogue controlled gain element is connected within a first signal path and the digitally controlled gain element is connected within a second signal path, the first and second signal paths being in parallel.

9. Gain control circuitry according to claim 6, further comprising a logic element having an input coupled to the output of the bi-directional counter and having a first output coupled to the digitally controlled gain element and a second output coupled to the analogue controlled gain element via a second digital-to-analogue converter, the logic element being arranged to provide first and second gain control signals from the first and second outputs respectively in dependence on the signal received at the input of the logic element.

10. Gain control circuitry according to claim 9, wherein the sum of the value of the first and second gain control signals provided by the logic element substantially equals the value of the signal received at the input of the logic element.

11. Gain control circuitry according to claim 9, wherein the second digital-to-analogue converter comprises an exponentiating digital-to-analogue converter, the exponentiating digital-to-analogue converter being configured to provide an analogue output signal having a value proportional to the exponential of the value of a digital signal received at a first input.

12. Gain control circuitry according to claim 11, wherein the exponentiating digital-to-analogue converter has a second input arranged to receive a reference voltage, the exponentiating digital-to-analogue converter being further configured such that the analogue output signal has a value proportional to the product of the reference signal multiplied by the exponential of the digital signal received at the first input.

13. A gain control system for controlling the gain applied to a signal, the gain control system comprising:
- a digitally controlled gain element configured to receive a first input signal and a first digital gain control signal, and to apply a gain to the first input signal in accordance with the digital gain control signal;
- an analogue controlled gain element configured to receive a second input signal and a first analogue gain control signal and to apply a gain to the second input signal in accordance with the received first analogue gain control signal;
- comparator circuitry configured to receive a first analogue input and provide a digital output in response to the first analogue input having a value greater than an upper threshold value or less than a lower threshold value;
- a bi-directional counter configured to provide the first digital gain control signal and to change the value of the first digital gain control signal in response to receiving the digital output from the comparator circuitry;
- a digital-to-analogue converter configured to convert the first digital gain control signal to an analogue signal; and
- a subtracting element configured to receive the analogue signal from the digital-to-analogue converter and a second analogue gain control signal and to provide an analogue output signal representative of the difference in value between the second analogue gain control signal and the digital gain control signal, the analogue output signal being provided as the analogue input signal to the comparator circuitry and as the first analogue control signal to the analogue controlled gain element.

* * * * *